United States Patent
Asari et al.

(10) Patent No.: US 7,416,405 B2
(45) Date of Patent: Aug. 26, 2008

(54) VERTICAL TYPE OF THERMAL PROCESSING APPARATUS AND METHOD OF USING THE SAME

(75) Inventors: Satoshi Asari, Tokyo-To (JP); Katsuhiko Mihara, Tokyo-To (JP)

(73) Assignee: Tokyo Electron Limited, Tokyo-To (JP)

( * ) Notice: Subject to any disclaimer, the term of this patent is extended or adjusted under 35 U.S.C. 154(b) by 57 days.

(21) Appl. No.: 11/630,146

(22) PCT Filed: Jun. 20, 2005

(86) PCT No.: PCT/JP2005/011235
§ 371 (c)(1),
(2), (4) Date: Dec. 20, 2006

(87) PCT Pub. No.: WO2006/003805
PCT Pub. Date: Jan. 12, 2006

(65) Prior Publication Data
US 2007/0231763 A1    Oct. 4, 2007

(30) Foreign Application Priority Data
Jun. 30, 2004    (JP)    ............... 2004-192490

(51) Int. Cl.
*F27D 3/12*    (2006.01)
(52) U.S. Cl. .............. 432/239; 432/241; 219/390; 438/715; 414/935; 414/938
(58) Field of Classification Search .......... 432/239, 432/241, 242; 219/209, 390; 438/660, 663, 438/715; 118/50.1, 724, 725; 414/935–941
See application file for complete search history.

(56) References Cited

U.S. PATENT DOCUMENTS 5,055,036 A  *  10/1991  Asano et al. .............. 432/5

(Continued)

FOREIGN PATENT DOCUMENTS

JP    2681055    8/1997

(Continued)

*Primary Examiner*—Gregory A Wilson
(74) *Attorney, Agent, or Firm*—Smith, Gambrell & Gambrell, LLP (57) ABSTRACT

A vertical type of thermal processing apparatus of the present invention includes a thermal processing furnace having a furnace opening at a lower portion thereof. A boat holding objects to be processed in a tier-like manner in a vertical direction is adapted to be contained in the thermal processing furnace through the furnace opening. A lid supporting the boat is capable of closing the furnace opening. A transferring chamber is connected to the furnace opening. An elevating mechanism provided in the transferring chamber is configured to move up and down the lid in order to load and unload the boat into and out from the thermal processing furnace. A connecting port provided at a wall of the transferring chamber is capable of being connected to an opening of a conveying container for containing the objects to be processed. A first containing portion provided in the transferring chamber is capable of temporarily containing unprocessed objects to be processed for a next thermal process. A second containing portion provided in the transferring chamber is capable of temporarily containing processed objects to be processed conveyed out from the thermal processing furnace. A transferring mechanism transfers objects to be processed between the conveying container, the first containing portion, the second containing portion and the boat.

2 Claims, 12 Drawing Sheets

U.S. PATENT DOCUMENTS

| | | | | |
|---|---|---|---|---|
| 5,316,472 A | * | 5/1994 | Niino et al. | 432/241 |
| 5,829,969 A | * | 11/1998 | Miyashita et al. | 432/253 |
| 6,318,944 B1 | * | 11/2001 | Shimeno et al. | 414/172 |
| 6,327,794 B2 | * | 12/2001 | Ishii | 34/408 |
| 2003/0053893 A1 | * | 3/2003 | Matsunaga et al. | 414/217 |

FOREIGN PATENT DOCUMENTS

| | | |
|---|---|---|
| JP | 10-321703 | 12/1998 |
| JP | 2000-150400 | 5/2000 |

* cited by examiner

VERTICAL TYPE OF THERMAL PROCESSING APPARATUS AND METHOD OF USING THE SAME

FIELD OF THE INVENTION

This invention relates to a vertical type of thermal processing apparatus and a method of using the same.

BACKGROUND ART

In manufacturing semiconductor devices, a vertical type of thermal processing apparatus is used, which is capable of thermally processing a large number of objects to be processed, such as semiconductor wafers (product wafers), at a time (large-amount batch process). For example, as shown in JP Laid-Open Publication No. 2000-150400 and JP Publication No. 2681055, a vertical type of thermal processing apparatus comprises a thermal processing furnace having a furnace opening at a lower portion thereof. A boat holding a large number of wafers (objects to be processed) in a tier-like manner in a vertical direction is contained inside the thermal processing furnace through the furnace opening. A lid supporting the boat can close the furnace opening. The furnace opening is connected to a transfer chamber. In the transfer chamber, an elevating mechanism is provided to move up and down the lid in order to load and unload the boat into and out from the thermal processing furnace. In the transfer chamber, provided are a boat placing portion on which two boats can be placed, a boat changing mechanism (boat changer) that can change boats between the boat placing portion and the lid, and a transferring mechanism that can transfer wafers between a conveying container (cassette, carrier, FOUP or the like) that can contain a plurality of wafers and a boat placed on the boat placing portion.

According to the above vertical type of thermal processing apparatus, the two boats can be used. Thus, while one boat is placed on the lid that can open and close the furnace opening of the thermal processing furnace, the boat is loaded into the thermal processing furnace, and wafers held on the boat are thermally processed, wafers can be transferred with respect to the other boat placed on the boat placing portion. Thus, throughput can be improved.

However, the boat changing mechanism is necessary in the above vertical type of thermal processing apparatus. Thus, the apparatus has to be large and hence cost thereof has to be large. In addition, if an earthquake occurs in changing the boats, the boats may be swung and fallen down, so that the wafers and the boats may be broken. Furthermore, when the two boats are used, depending on minute difference between boats' shapes and difference between boats' operating situations, film-forming property to the wafers may be not uniform. In addition, in this case, it is difficult to manage total thickness of films on the boats.

In addition, if a small-amount batch process is conducted wherein the number of product wafers is small and the number of dummy wafers (Fill Dummy) is large, it is necessary to store (stock) a conveying container for the dummy wafers in the transferring chamber. Thus, a space and a facility for the conveying container are necessary, which enlarges the apparatus and increases cost of the apparatus.

SUMMARY OF THE INVENTION

This invention is intended to solve the above problems. The object of this invention is to provide a vertical type of thermal processing apparatus that can be made compact, that can reduce cost, and that can improve earthquake resistance, and to provide a method of using the vertical type of thermal processing apparatus.

The present invention is a vertical type of thermal processing apparatus comprising: a thermal processing furnace having a furnace opening at a lower portion thereof, a boat holding objects to be processed in a tier-like manner in a vertical direction being adapted to be contained in the thermal processing furnace through the furnace opening in order to conduct a thermal process to the objects to be processed; a transferring chamber connected to the furnace opening; a lid supporting the boat, capable of closing the furnace opening; an elevating mechanism provided in the transferring chamber, configured to move up and down the lid in order to load and unload the boat into and out from the thermal processing furnace; a connecting port provided at a wall of the transferring chamber, capable of being connected to an opening of a conveying container for containing the objects to be processed; a first containing portion provided in the transferring chamber, capable of temporarily containing unprocessed objects to be processed for a next thermal process; a second containing portion provided in the transferring chamber, capable of temporarily containing processed objects to be processed conveyed out from the thermal processing furnace; and a transferring mechanism that transfers objects to be processed between the conveying container, the first containing portion, the second containing portion and the boat.

According to the invention, since a first containing portion capable of temporarily containing unprocessed objects to be processed for a next thermal process and a second containing portion capable of temporarily containing processed objects to be processed conveyed out from the thermal processing furnace are provided in the transferring chamber, it is unnecessary to provide a boat changing mechanism. Thus, the apparatus can be made compact, cost of the apparatus can be reduced, and earthquake resistance of the apparatus can be improved.

Preferably, a dummy containing portion capable of temporarily containing dummy objects to be processed is attached to each of the first containing portion and the second containing portion. In the case, a large number of dummy wafers can be stored in the transferring chamber without using a conveying container for the dummy wafers, which is suitable for a small-amount batch process.

In addition, the present invention is a method of using a vertical type of thermal processing apparatus including: a thermal processing furnace having a furnace opening at a lower portion thereof, a boat holding objects to be processed in a tier-like manner in a vertical direction being adapted to be contained in the thermal processing furnace through the furnace opening in order to conduct a thermal process to the objects to be processed; a transferring chamber connected to the furnace opening; a lid supporting the boat, capable of closing the furnace opening; an elevating mechanism provided in the transferring chamber, configured to move up and down the lid in order to load and unload the boat into and out from the thermal processing furnace; a connecting port provided at a wall of the transferring chamber, capable of being connected to an opening of a conveying container for containing the objects to be processed; a first containing portion provided in the transferring chamber, capable of temporarily containing unprocessed objects to be processed for a next thermal process; a second containing portion provided in the transferring chamber, capable of temporarily containing processed objects to be processed conveyed out from the thermal processing furnace; and a transferring mechanism that transfers objects to be processed between the conveying container, the first containing portion, the second containing portion and the boat; the method comprising: a first transferring step of transferring unprocessed objects to be processed from a conveying container onto the boat; a first loading step of loading the boat into the thermal processing furnace, after the first transferring step; a first thermal processing step of thermally processing the unprocessed objects to be processed held on the boat, after the first loading step; a second transferring step of transferring unprocessed objects to be processed from the conveying container or a next second conveying container to the first containing portion, during the first thermal processing step; a first unloading step of unloading the boat out from the thermal processing furnace, after the first thermal processing step; a third transferring step of transferring the processed objects to be processed held on the boat to the second containing portion, after the first unloading step; a fourth transferring step of transferring the unprocessed objects to be processed from the first containing portion to the boat, after the third transferring step; a second loading step of loading the boat into the thermal processing furnace, after the fourth transferring step; a second thermal processing step of thermally processing the unprocessed objects to be processed held on the boat, after the second loading step; and a fifth transferring step of transferring the processed objects to be processed from the second containing portion to the conveying container or the second conveying container, during the second thermal processing step.

According to the invention, the apparatus can be made compact, cost of the apparatus can be reduced, and earthquake resistance of the apparatus can be improved. In addition, a large-amount batch process can be conducted easily.

In addition, the present invention is a method of using a vertical type of thermal processing apparatus including: thermal processing furnace having a furnace opening at a lower portion thereof; a boat holding objects to be processed in a tier-like manner in a vertical direction being adapted to be contained in the thermal processing furnace through the furnace opening in order to conduct a thermal process to the objects to be processed; a transferring chamber connected to the furnace opening; a lid supporting the boat, capable of closing the furnace opening; an elevating mechanism provided in the transferring chamber, configured to move up and down the lid in order to load and unload the boat into and out from the thermal processing furnace; a connecting port provided at a wall of the transferring chamber, capable of being connected to an opening of a conveying container for containing the objects to be processed; a first containing portion provided in the transferring chamber, capable of temporarily containing unprocessed objects to be processed for a next thermal process; a second containing portion provided in the transferring chamber, capable of temporarily containing processed objects to be processed conveyed out from the thermal processing furnace; a dummy containing portion provided in the transferring chamber, capable of temporarily containing dummy objects to be processed; and a transferring mechanism that transfers objects to be processed between the conveying container, the first containing portion, the second containing portion, the dummy containing portion and the boat; the method comprising: a first transferring step of transferring unprocessed objects to be processed from a conveying container onto the boat, and transferring dummy objects to be processed that have been contained in the dummy containing portion from the dummy containing portion onto the boat; a first loading step of loading the boat into the thermal processing furnace, after the first transferring step; a first thermal processing step of thermally processing the unprocessed objects to be processed held on the boat, after the first loading step; a second transferring step of transferring unprocessed objects to be processed from the conveying container or a next second conveying container to the first containing portion, during the first thermal processing step; a first unloading step of unloading the boat out from the thermal processing furnace, after the first thermal processing step; a third transferring step of transferring the processed objects to be processed held on the boat to the second containing portion, and transferring the dummy objects to be processed held on the boat to the dummy containing portion if necessary, after the first unloading step; a fourth transferring step of transferring the unprocessed objects to be processed from the first containing portion to the boat, and transferring dummy objects to be processed that have been contained in the dummy containing portion from the dummy containing portion onto the boat if necessary, after the third transferring step; a second loading step of loading the boat into the thermal processing furnace, after the fourth transferring step; a second thermal processing step of thermally processing the unprocessed objects to be processed held on the boat, after the second loading step; and a fifth transferring step of transferring the processed objects to be processed from the second containing portion to the conveying container or the second conveying container, during the second thermal processing step.

According to the invention, the apparatus can be made compact, cost of the apparatus can be reduced, and earthquake resistance of the apparatus can be improved. In addition, a small-amount batch process can be conducted easily.

DESCRIPTION OF THE PREFERRED EMBODIMENTS

Figure 1:
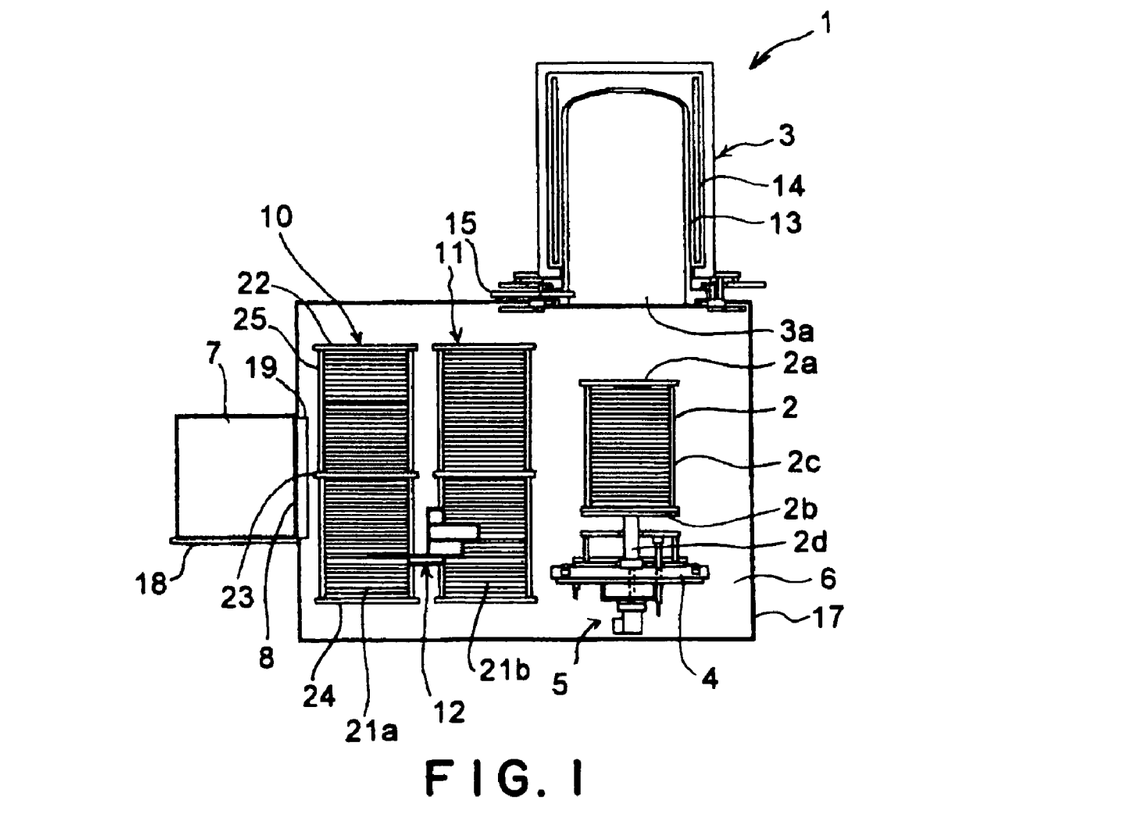
FIG. 1 is a schematic vertical sectional view showing a vertical type of thermal processing apparatus according to an embodiment of the present invention.
Figure 2:
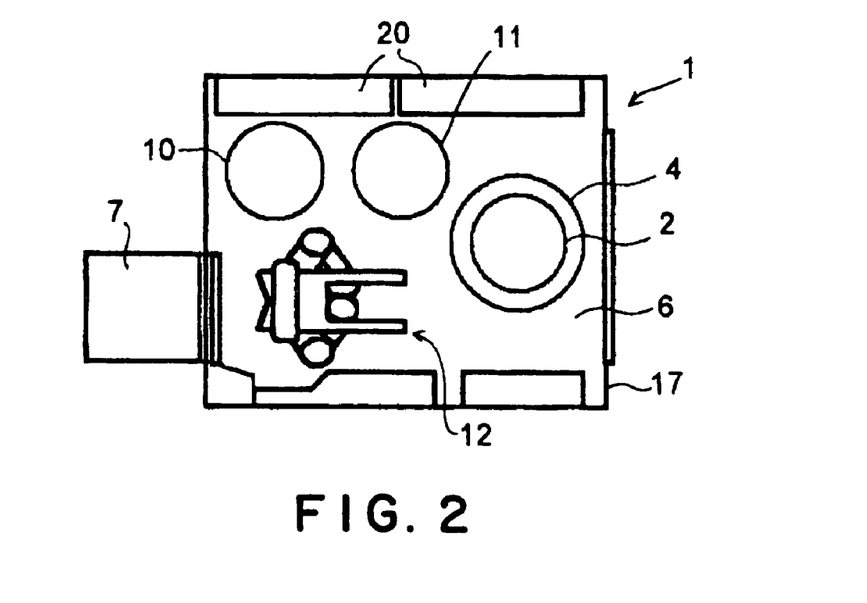
FIG. 2 is a schematic transversal sectional view showing the vertical type of thermal processing apparatus of FIG. 1.

Hereinafter, embodiments of the present invention are described in details based on the attached drawings. FIG. 1 is a schematic vertical sectional view showing a vertical type of thermal processing apparatus according to an embodiment of the present invention. FIG. 2 is a schematic transversal sectional view showing the vertical type of thermal processing apparatus of FIG. 1.

In these drawings, a vertical type of thermal processing apparatus 1 of the present embodiment comprises a thermal processing furnace 3 having a furnace opening 3a at a lower portion thereof. A boat 2 holding a large number of (for example about 50 to 150) semiconductor wafers as objects to be processed in a tier-like manner in a vertical direction is contained inside the thermal processing furnace 3 through the furnace opening 3a. A lid 4 supporting the boat 2 can close the furnace opening 3a. The thermal processing furnace 3 can conduct a thermal process (batch process) to the wafers contained therein under a situation wherein the furnace opening 3a is closed.

A transferring chamber (loading area) 6 is connected to the furnace opening 3a. An elevating mechanism 5 configured to move up and down the lid 4 in order to load and unload the boat 2 into and out from the thermal processing furnace 3 is provided in the transferring chamber 6. A connecting port 8 capable of being connected to an opening of a conveying container 7 for containing a plurality of (for example about 25) wafers is provided at a wall of the transferring chamber 6. A first containing portion 10 capable of temporarily containing unprocessed wafers wa for a next thermal process (batch process) and a second containing portion 11 capable of temporarily containing processed wafers wb conveyed out from the thermal processing furnace 3 are provided in the transferring chamber 6. A transferring mechanism 12 that transfers wafers between the conveying container 7, the first containing portion 10, the second containing portion 11 and the boat 2 is provided in the transferring chamber 6.

As objects to be processed, for example, wafers with a large diameter of 300 mm are used. The thermal processing furnace 3 mainly consists of a processing container (process tube) 13 made of quartz having a lower end opening, and a heating mechanism (heater) 14 provided so as to surround the processing container 13.

In the processing container 13, provided are a gas introducing part 15 that introduces a process gas and/or an inert gas (such as an $N_2$ gas), and a gas-discharging part (not shown) connected to a vacuum or pressure-reducing gas-discharging system that can discharge gas from the processing container 13 in order to reduce a pressure in the processing container 13 to a predetermined pressure. It is preferable to provide a shutter (not shown) capable of covering (closing) the furnace opening 3a after the lid 4 is moved down and the boat 2 is unloaded out from the thermal processing furnace 3, in the vicinity of the furnace opening 3a.

The boat 2 is made of quartz, for example. The boat 2 has a plurality of columns 2c between a ceiling plate 2a and a bottom plate 2b. In order to hold a large number of wafers (including monitor wafers and dummy wafers) at predetermined gaps in a tier-like manner, holding parts such as holding grooves are provided at the plurality of columns 2c. In addition, the boat 2 of FIG. 1 includes a supporting leg 2d. The supporting leg 2d is connected to a rotation introducing part (not shown) that hermetically pierces through the lid 4. Thus, the boat 2 is adapted to be rotated during a thermal process.

As a conveying container 7, for example, a conveying container (FOUP) having a detachable and airtight lid at a front portion thereof is used. The transferring chamber 6 is defined by a housing 17 (wall part). The connecting port 8 is provided at a front wall part of the transferring chamber 6. A system called FIMS (Front Interface Mechanical System) is provided at the connecting port 8. That is, provided are a stage 18 for placing the conveying container 7 thereon, a holding mechanism that keeps a front periphery of the conveying container 7 placed on the stage 18 in close contact with the connecting port 8, a door mechanism 19 that covers and opens the connecting port 6 from an inside of the transferring chamber 6, and a lid-removing mechanism (not shown) that removes the lid from the conveying container 7.

As shown in FIG. 2, on one lateral side in the transferring chamber 6, installed is an air cleaning apparatus 20 that blows clean air or a clear gas (such as a clean inert gas) toward the other opposite lateral side. In the present embodiment, the first containing part 10 and the second containing part 11 are installed in the vicinity of the air cleaning apparatus 20. The transferring mechanism 12 is arranged between the first containing part 10 and the second containing part 11 and a wall of the other lateral side. The connecting port 8 is arranged on a side of the transferring mechanism 12 (in the vicinity of the transferring mechanism 12), not on a side of the first containing part 10 and the second containing part 11.

As shown in FIG. 1, the thermal processing furnace 3 is installed at a rear ceiling portion of the transferring chamber 6. In a plan view thereof, as shown in FIG. 2, the transferring mechanism 12 is arranged between the connecting port 8 at the front of the transferring chamber 6 and the thermal processing furnace 3 at-the rear of the transferring chamber 6. The first containing part 10 and the second containing part 11 are arranged alongside on the one lateral side of the transferring mechanism 12.

The transferring mechanism 12 mainly consists of an extended stage 12a structured to be movable in vertical and horizontal directions and pivotable, and a transferring arm 12b having a shape of thin plural (for example, five) forks for holding wafers. The transferring arm 12b is movable forward and backward on the stage 12a in an extended direction of the stage 12a.

Dummy containing portions 21a and 21b capable of temporarily containing dummy wafers dw (dummy objects to be processed) are respectively attached to the first containing portion 10 and the second containing portion 11 in the present embodiment. Each of the first containing portion 10 and the second containing portion 11 is capable of holding a large number of (for example, about 150) wafers at predetermined gaps in a tier-like manner in a vertical direction. On the other hand, each of the dummy containing portions 21a and 21b is capable of holding a large number of (for example, about 50) dummy wafers at predetermined gaps in a tier-like manner in a vertical direction. In order to restrain effect of particles caused by the dummy wafers, it is preferable to provide the dummy containing portions 21a and 21b under the first containing portion 10 and the second containing portion 11, respectively.

The first containing portion 10 and the second containing portion 11 may be made in the same structure as the boat made of quartz. However, in general, the first containing portion 10 and the second containing portion 11 are fixed in the transferring chamber 6 in an unmovable way. For example, a plurality of columns 25 made of quartz is provided between a ceiling plate 22 and a dividing plate 23 and a bottom plate 24, which are also made of quartz. In order to hold a large number of wafers (including monitor wafers and dummy wafers) at predetermined gaps in a tier-like manner, holding parts such as holding grooves are provided at the plurality of columns 25. Then, an area between the ceiling plate 22 and the dividing plate 23 is available as the first containing portion 10 or the second containing portion 11, and an area between the dividing plate 23 and the bottom plate 24 is available as the dummy containing portion 21a or 21b.

According to the above vertical type of thermal processing apparatus 1, since the first containing portion 10 capable of temporarily containing a predetermined number of wafers wa for a next thermal process and the second containing portion 11 capable of temporarily containing processed wafers conveyed out from the thermal processing furnace 3 are provided in the transferring chamber 6, it is unnecessary to provide a boat changing mechanism for the boat 2. Thus, the apparatus can be made compact, cost of the apparatus can be reduced, and earthquake resistance of the apparatus can be improved. In addition, since the dummy containing portions 21a and 21b capable of temporarily containing the dummy wafers dw are attached to the first containing portion 10 and the second containing portion 11, a large number of dummy wafers can be stored in the transferring chamber 6 without using a conveying container for the dummy wafers or a stocker for the same. Thus, a small-amount batch process can be easily conducted.

Next, a using (operating) method of the above vertical type of thermal processing apparatus is explained. First, a first operating method suitable for a large-amount batch process is explained with reference to FIGS. 3 to 11.

Figure 3:
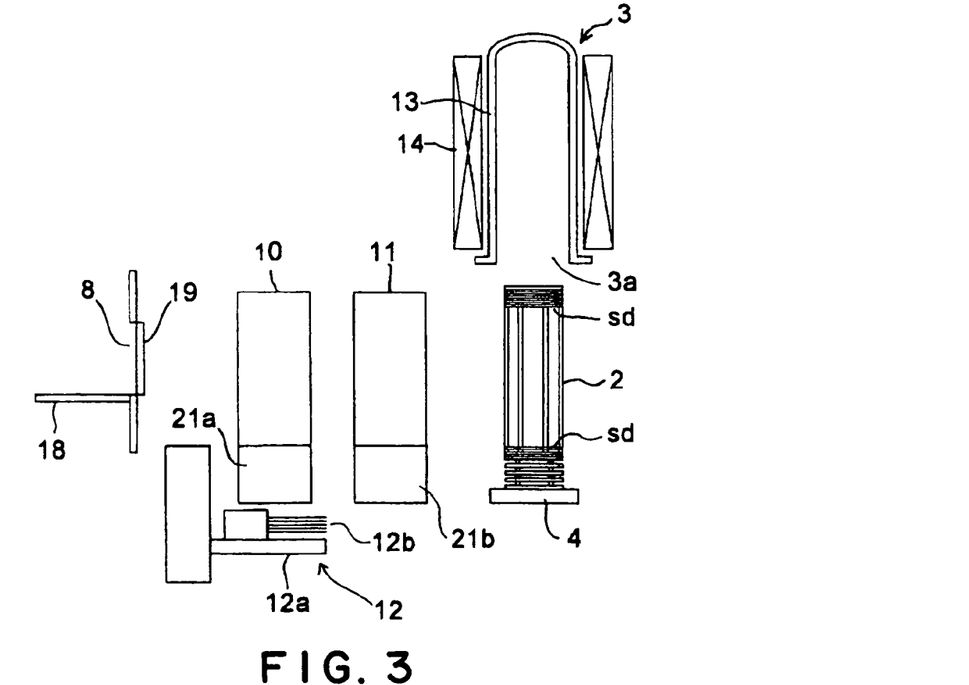
FIG. 3 is a schematic side view showing an initial state of an embodiment (first embodiment) of a method of using the vertical type of thermal processing apparatus of FIG. 1.
Figure 4:
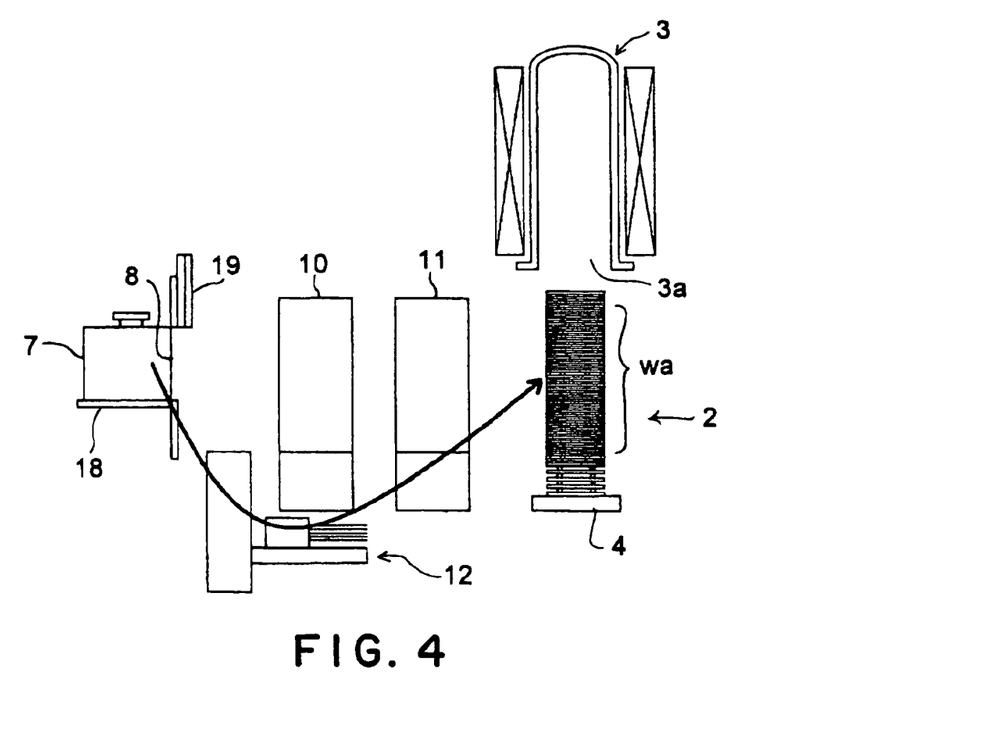
FIG. 4 is a schematic side view showing a step (first transferring step) of transferring wafers from a conveying container onto the boat.
Figure 5:
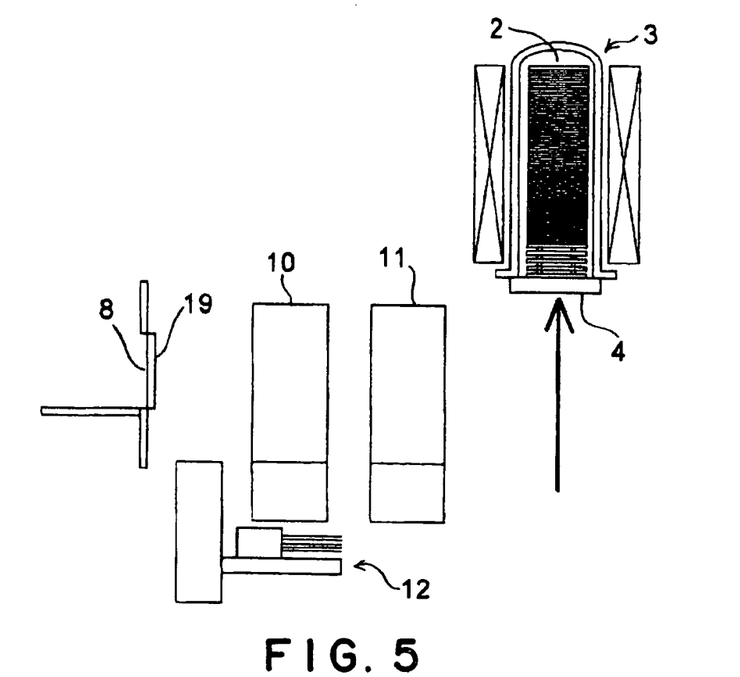
FIG. 5 is a schematic side view showing a step (first loading step) of loading the boat into the thermal processing furnace.

In the first operating method, at one batch process, for example, 125 product wafers, 5 monitor wafers and 10 side dummy wafers are used. As shown in FIG. 3, in an initial state in the first operating method, no wafer is contained in the first containing part 10 and the second containing part 11. Only the side dummy wafers sd are held on the boat 2 in a stand-by state that has been conveyed out from the thermal processing furnace 3. In that state, as shown in FIG. 4, the conveying container 7 is conveyed and connected to the connecting port 8 of the transferring chamber 6, and the predetermined number of wafers wa is transferred onto the boat 2 from the conveying container 7 by the transferring mechanism 12 (first transferring step). Then, as shown in FIG. 5, the boat 2 is loaded into the thermal processing furnace 3 (first loading step), and the thermal process to the wafers wa is started (first thermal processing step). Herein, at the connecting port 8, correspondingly to the number of wafers necessary for one batch process, the conveying container 7 may be replaced in turn.

Figure 6:
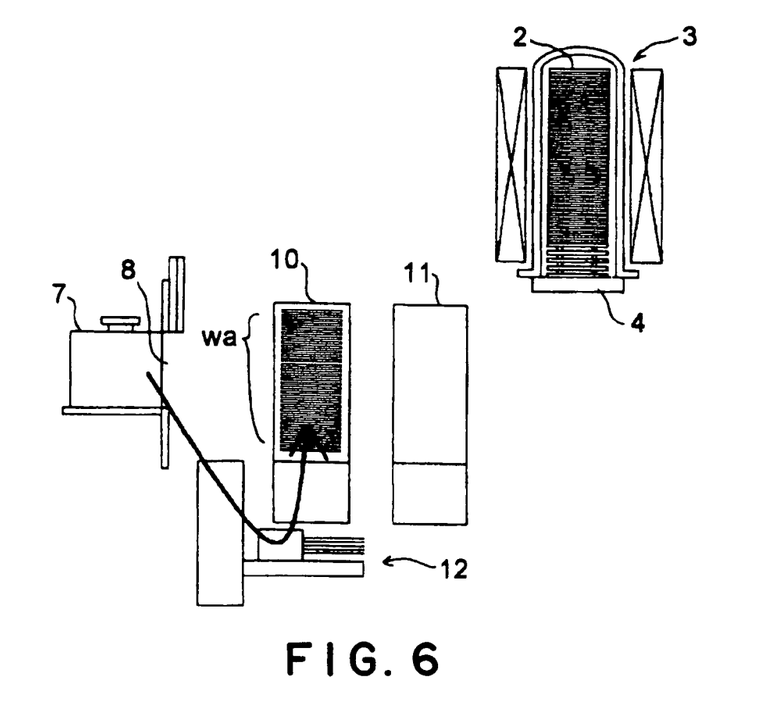
FIG. 6 is a schematic side view showing a step (second transferring step) of transferring wafers from the conveying container to the first containing portion, during the thermal process (first thermal processing step)
Figure 7:
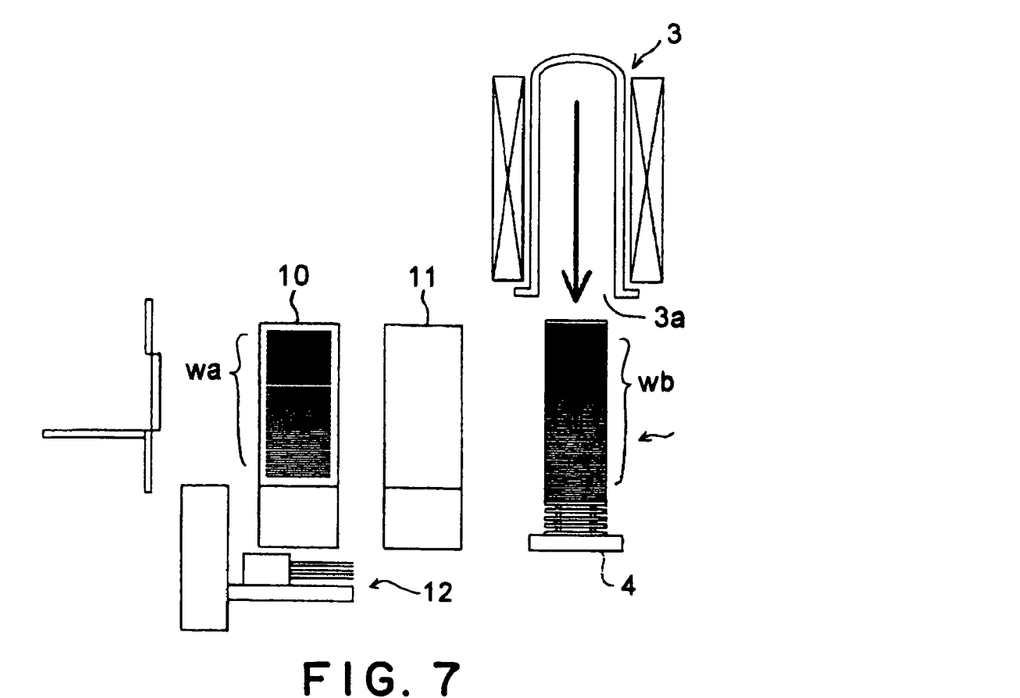
FIG. 7 is a schematic side view showing a step (first unloading step) of unloading the boat out from the thermal processing furnace, after the thermal process.
Figure 8:
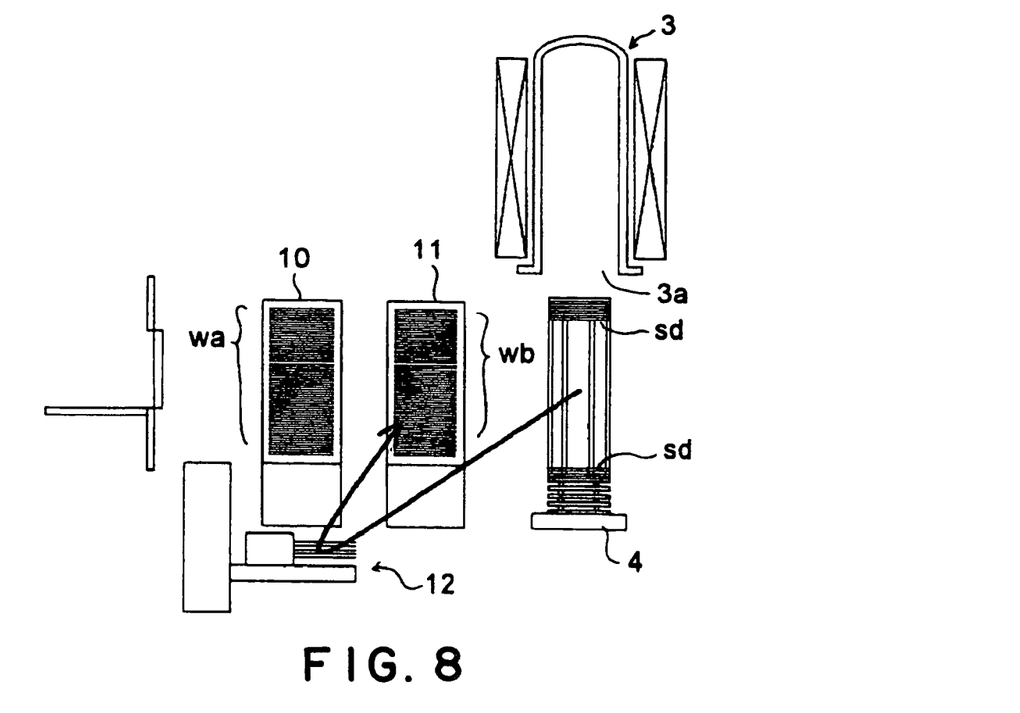
FIG. 8 is a schematic side view showing a step (third transferring step) of transferring the processed wafers from the boat to the second containing portion.
Figure 9:
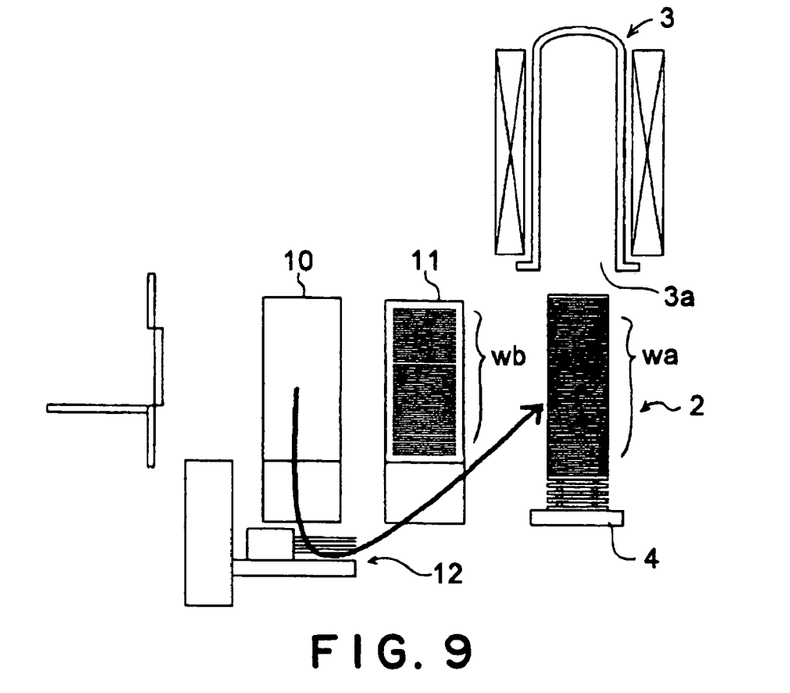
FIG. 9 is a schematic side view showing a step (fourth transferring step) of transferring the wafers from the first containing portion to the boat.
Figure 10:
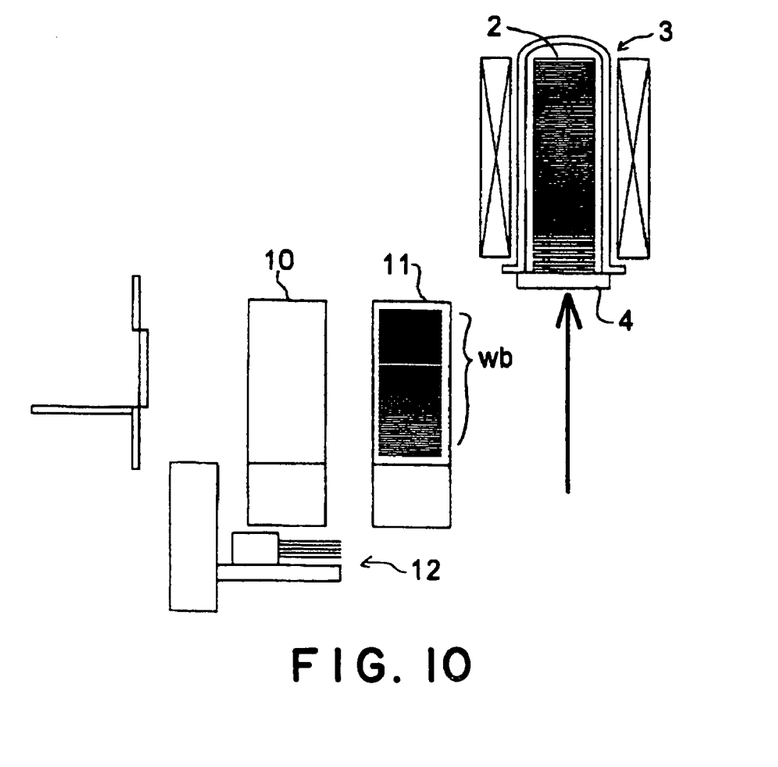
FIG. 10 is a schematic side view showing a step (second loading step) of loading the boat into the thermal processing furnace again.
Figure 11:
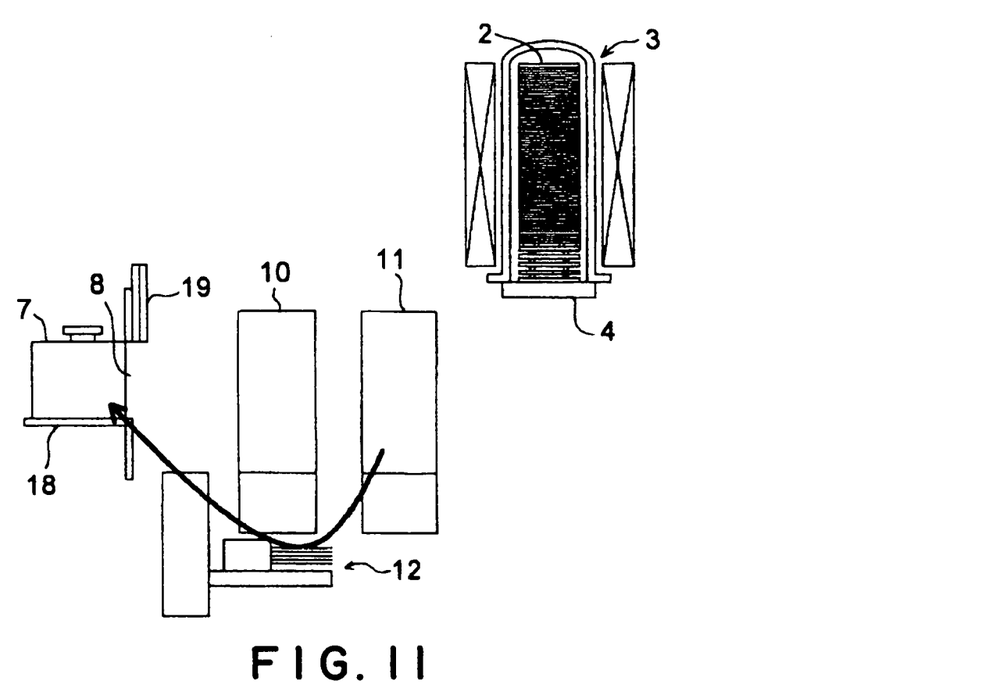
FIG. 11 is a schematic side view showing a step (fifth transferring step) of transferring the processed wafers from the second containing portion to the conveying container, during the thermal process (second thermal processing step)
Figure 12:
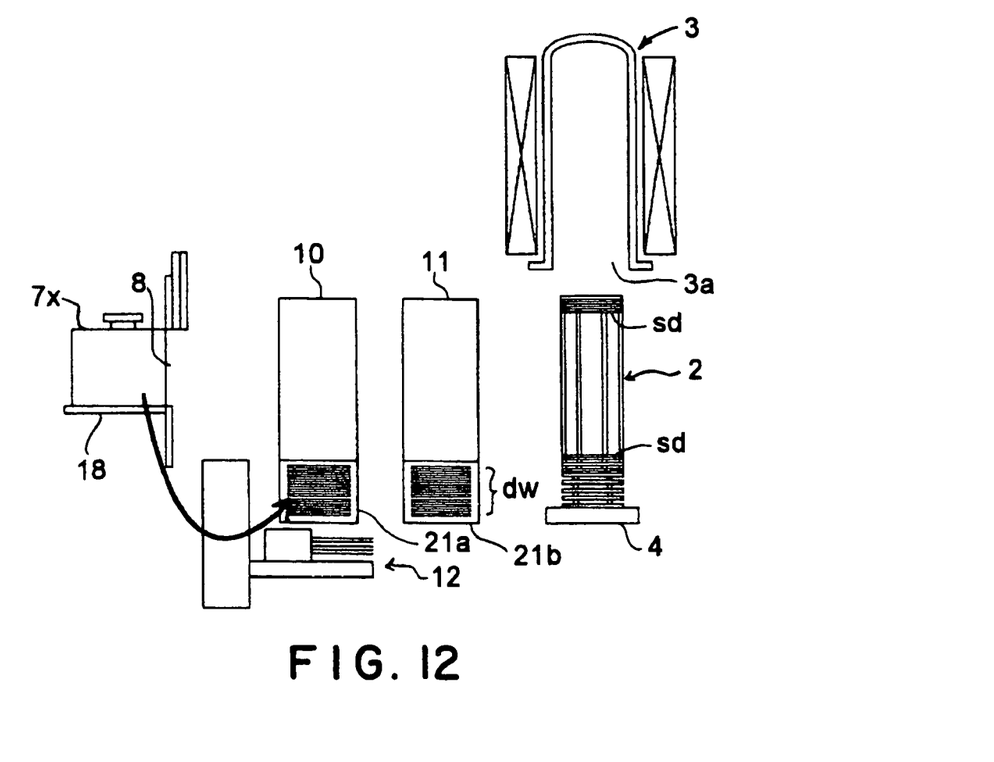
FIG. 12 is a schematic side view showing a step of transferring dummy wafers from a conveying container to the dummy containing portion, in another embodiment (second embodiment) of a method of using the vertical type of thermal processing apparatus of FIG. 1.

Then, during the thermal process (first thermal processing step), as shown in FIG. 6, the predetermined number of wafers wa is transferred from a next conveying container 7 (second conveying container) to the first containing part 10 by the transferring mechanism 12 (second transferring step). After the thermal process, as shown in FIG. 7, the boat 2 is unloaded from the thermal processing furnace 3 (first loading step), and as shown in FIG. 8, processed wafers wb are transferred from the boat 2 to the second containing portion 11 by the transferring mechanism 12 (third transferring step). After the third transferring step, as shown in FIG. 9, the wafers wa are transferred from the first containing portion 10 to the boat 2 by the transferring mechanism 12 (fourth transferring step). After the fourth transferring step, as shown in FIG. 10, the boat 2 is loaded into the thermal processing furnace 3 (second loading step), so that the thermal process is conducted (second thermal processing step). During the thermal processing step (second thermal processing step), as shown in FIG. 11, the processed wafers are transferred from the second containing portion 11 to a vacant conveying container 7 connected to the connecting port 8 by the transferring mechanism 12 (fifth transferring step). Thus, one batch process is completed. After the fifth transferring step, the first transferring step explained with reference to FIG. 6 is conducted again. Then, the batch process is repeated in the same cycle.

As described above, according to the first operating method of the above vertical type of thermal processing apparatus, the apparatus can be made compact, cost of the apparatus can be reduced, and earthquake resistance of the apparatus can be improved. In addition, a large-amount batch process can be easily conducted.

Next, a second operating method suitable for a small-amount batch process is explained with reference to FIGS. 12 to 23.

In the second operating method, at one batch process, for example, 50 product wafers, 3 monitor wafers, 10 side dummy wafers and 50 fill dummy wafers are used. Differently from the case of FIG. 3, in an initial state in the second operating method, a conveying container 7x for the dummy wafers is connected to the connecting port 8, and the predetermined number of dummy wafers dw are transferred from the conveying container 7x to the dummy containing portion 21a of the first containing portion 10 and the dummy containing portion 21b of the second containing portion 11 by the transferring mechanism 12 (see FIG. 12). On the other hand, similarly to the case of FIG. 3, only the side dummy wafers sd are held on the boat 2 in a stand-by state that has been conveyed out from the thermal processing furnace 3.

Figure 13:
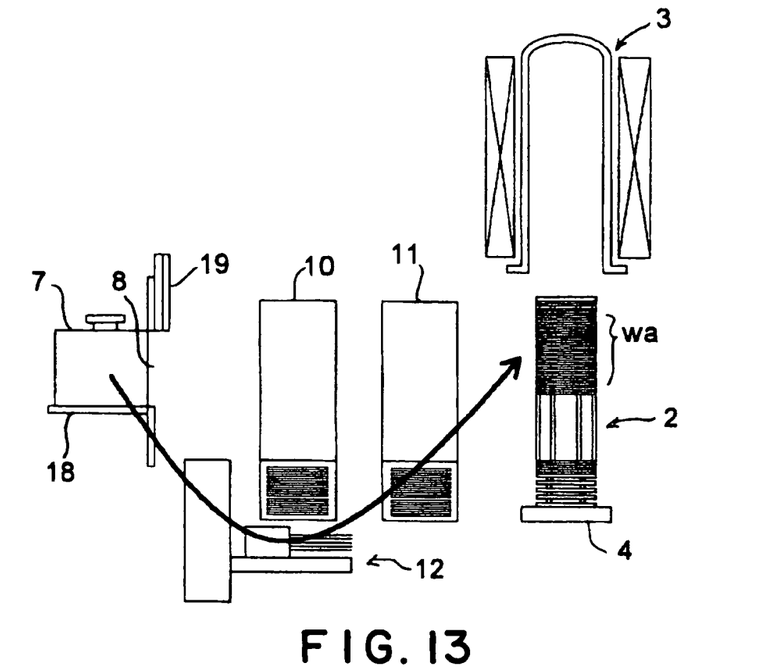
FIG. 13 is a schematic side view showing a step (first transferring step) of transferring wafers from a conveying container onto the boat.
Figure 14:
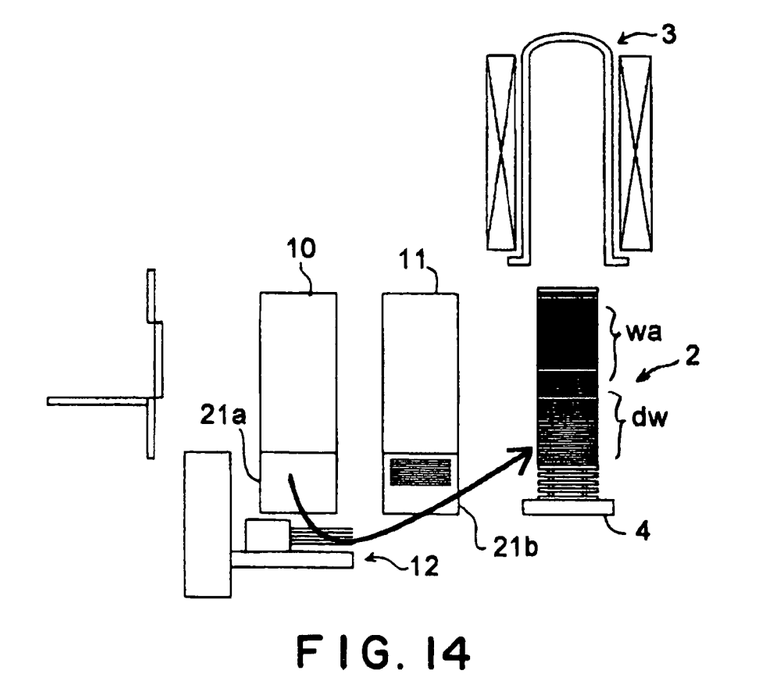
FIG. 14 is a schematic side view showing a step (first transferring step) of transferring the dummy wafers from the dummy containing portion onto the boat.
Figure 15:
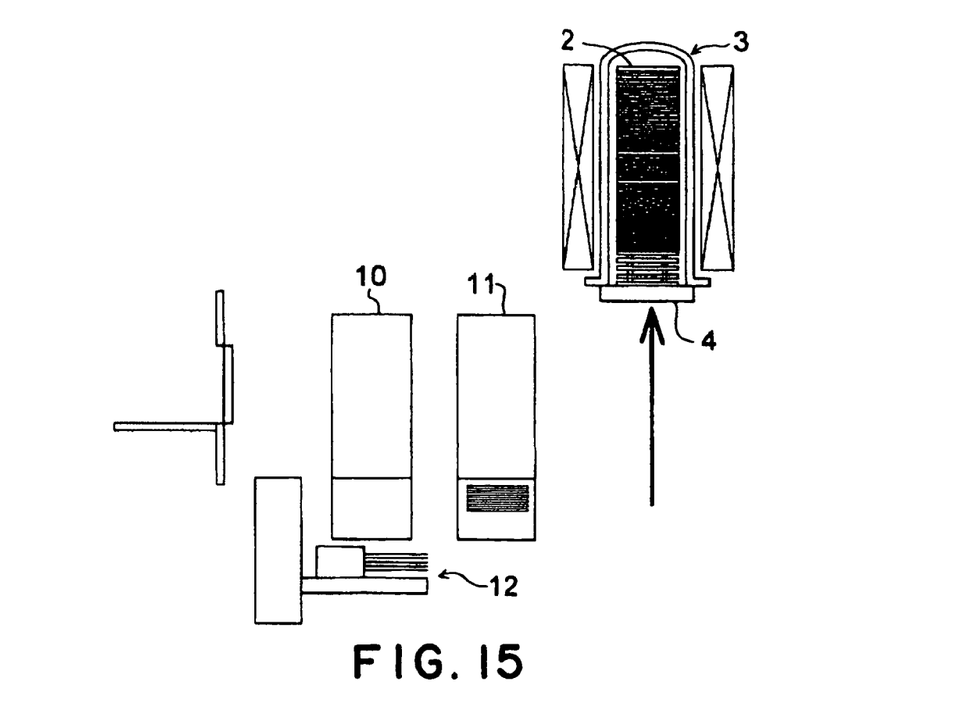
FIG. 15 is a schematic side view showing a step (first loading step) of loading the boat into the thermal processing furnace.

In that state, as shown in FIG. 13, the conveying container 7 is conveyed and connected to the connecting port 8 of the transferring chamber 6, and the predetermined number of wafers wa are transferred onto the boat 2 from the conveying container 7 by the transferring mechanism 12 (first transferring step). In addition, as shown in FIG. 14, a predetermined number of dummy wafers dw are transferred from the dummy containing portions 21a and 21b to the boat 2 (first transferring step). Then, as shown in FIG. 15, the boat 2 is loaded into the thermal processing furnace 3 (first loading step), and the thermal process to the wafers wa is started (first thermal processing step).

Figure 16:
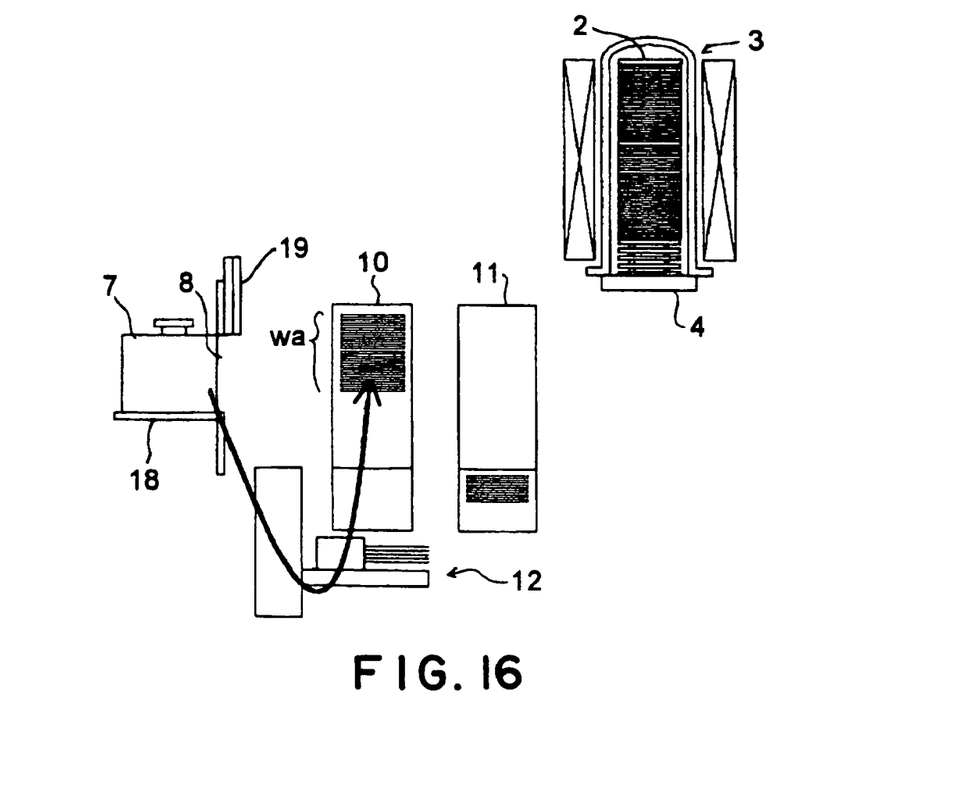
FIG. 16 is a schematic side view showing a step (second transferring step) of transferring wafers from the conveying container to the first containing portion, during the thermal process (first thermal processing step)
Figure 17:
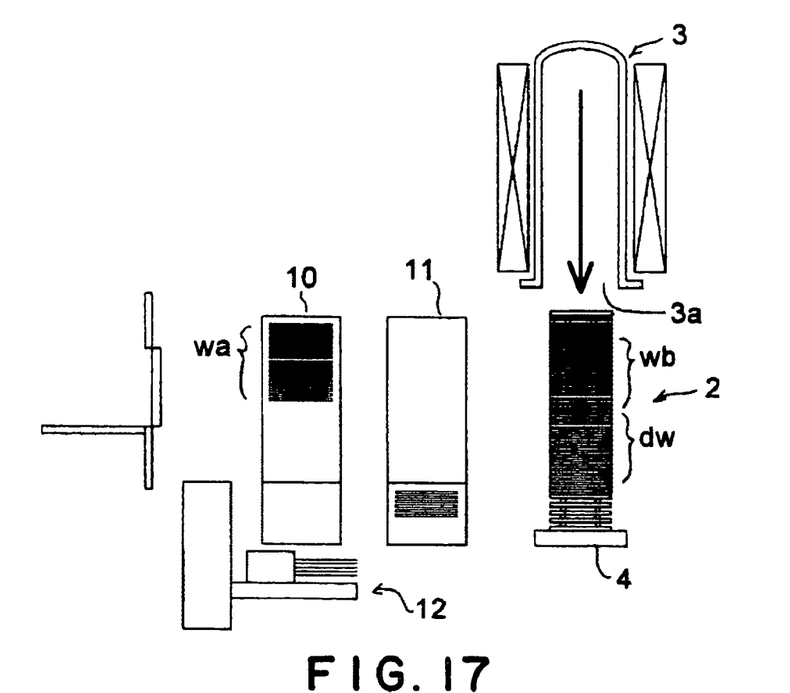
FIG. 17 is a schematic side view showing a step (first unloading step) of unloading the boat out from the thermal processing furnace, after the thermal process.
Figure 18:
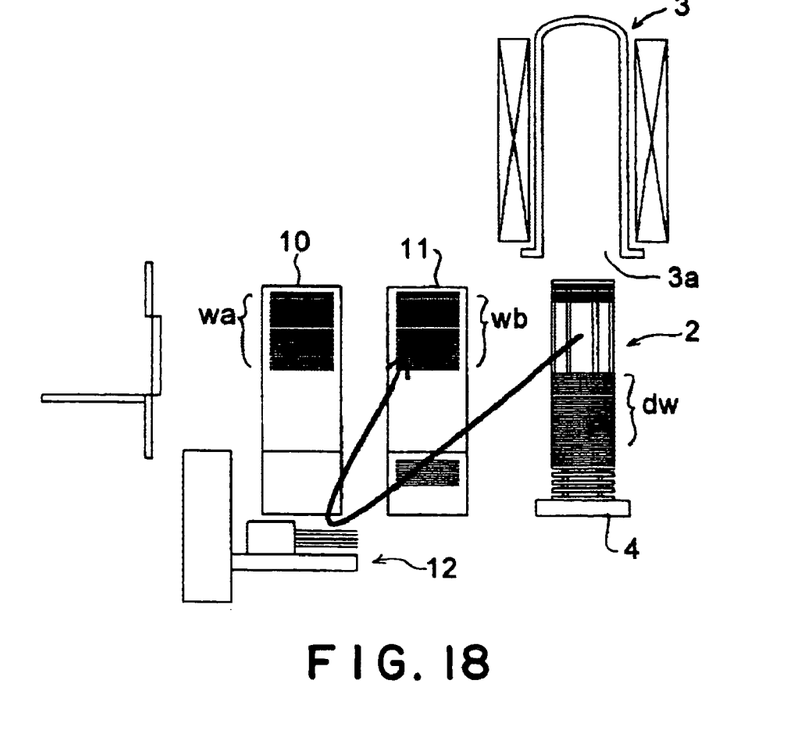
FIG. 18 is a schematic side view showing a step (third transferring step) of transferring the processed wafers from the boat to the second containing portion.
Figure 19:
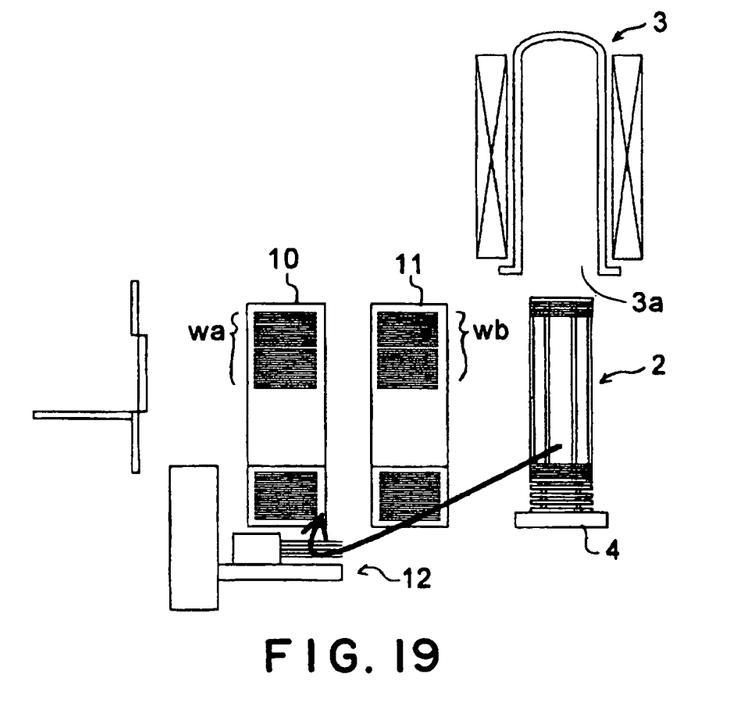
FIG. 19 is a schematic side view showing a step (third transferring step) of transferring the dummy wafers from the boat to the dummy containing portion.

Then, during the thermal process (first thermal processing -step), as shown in FIG. 16, the predetermined number of wafers wa is transferred from a next conveying container 7 (second conveying container) to the first containing part 10 by the transferring mechanism 12 (second transferring step). After the thermal process, as shown in FIG. 17, the boat 2 is unloaded from the thermal processing furnace 3 (first loading step), and as shown in FIG. 18, processed wafers wb are transferred from the boat 2 to the second containing portion 11 by the transferring mechanism 12 (third transferring step). In addition, if necessary, as shown in FIG. 19, a predetermined number of dummy wafers dw are transferred from the boat 2 to the dummy containing portions 21a and 21b (third transferring step).

Figure 20:
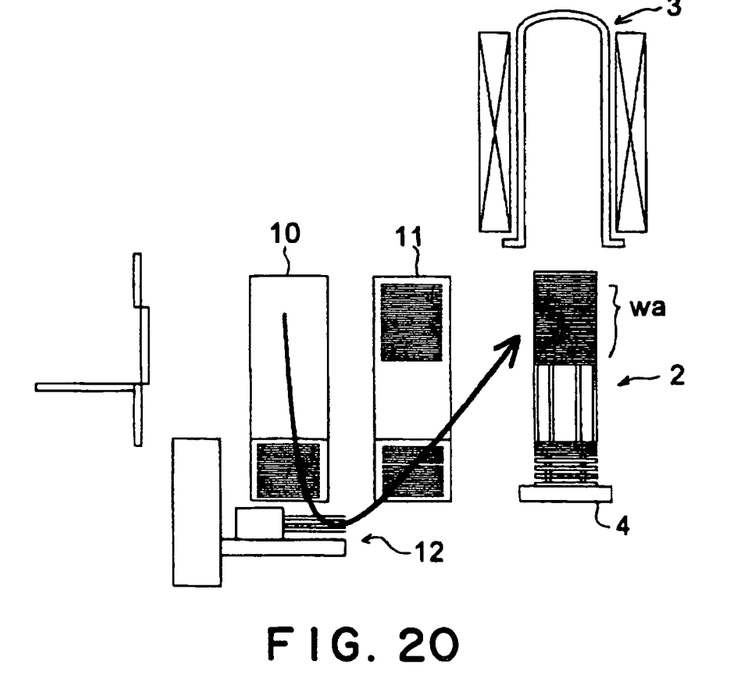
FIG. 20 is a schematic side view showing a step (fourth transferring step) of transferring the wafers from the first containing portion to the boat.
Figure 21:
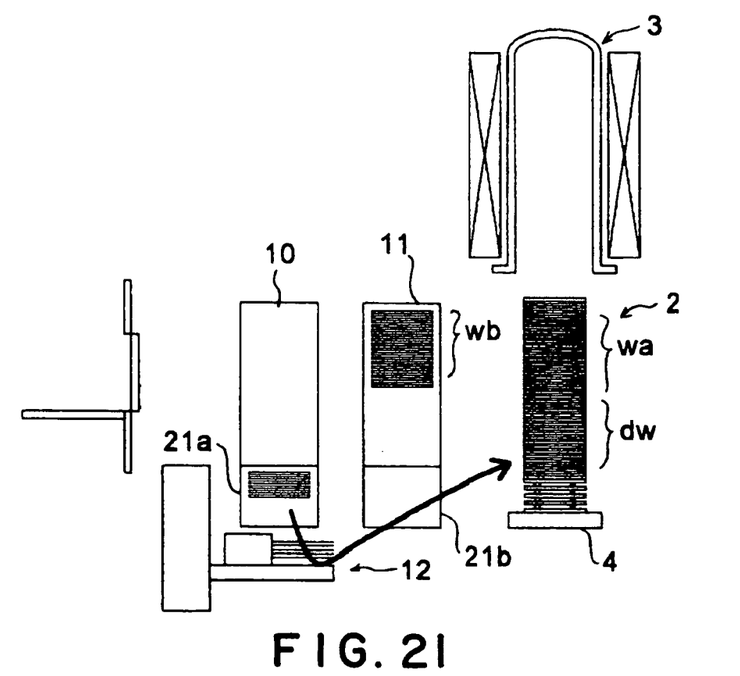
FIG. 21 is a schematic side view showing a step (fourth transferring step) of transferring the dummy wafers from the dummy containing portion onto the boat.
Figure 22:
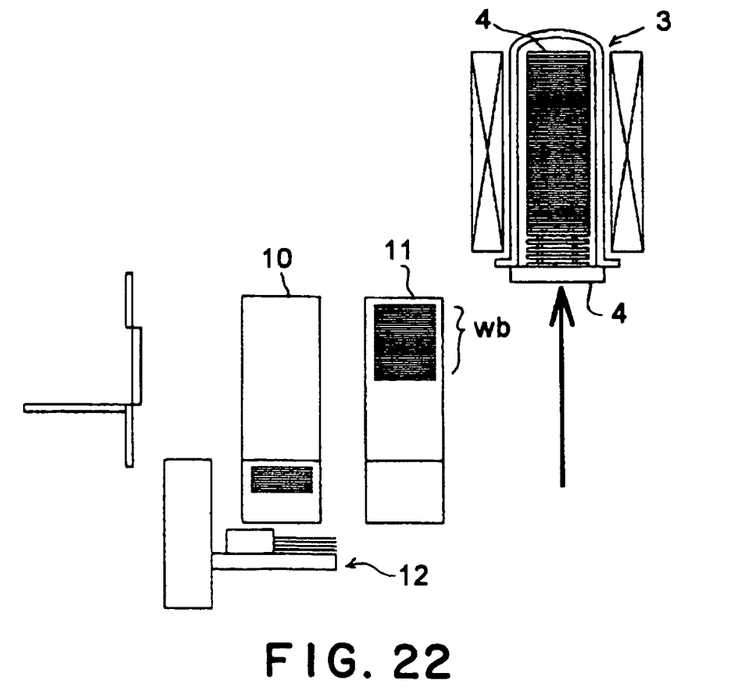
FIG. 22 is a schematic side view showing a step (second loading step) of loading the boat into the thermal processing furnace again.
Figure 23:
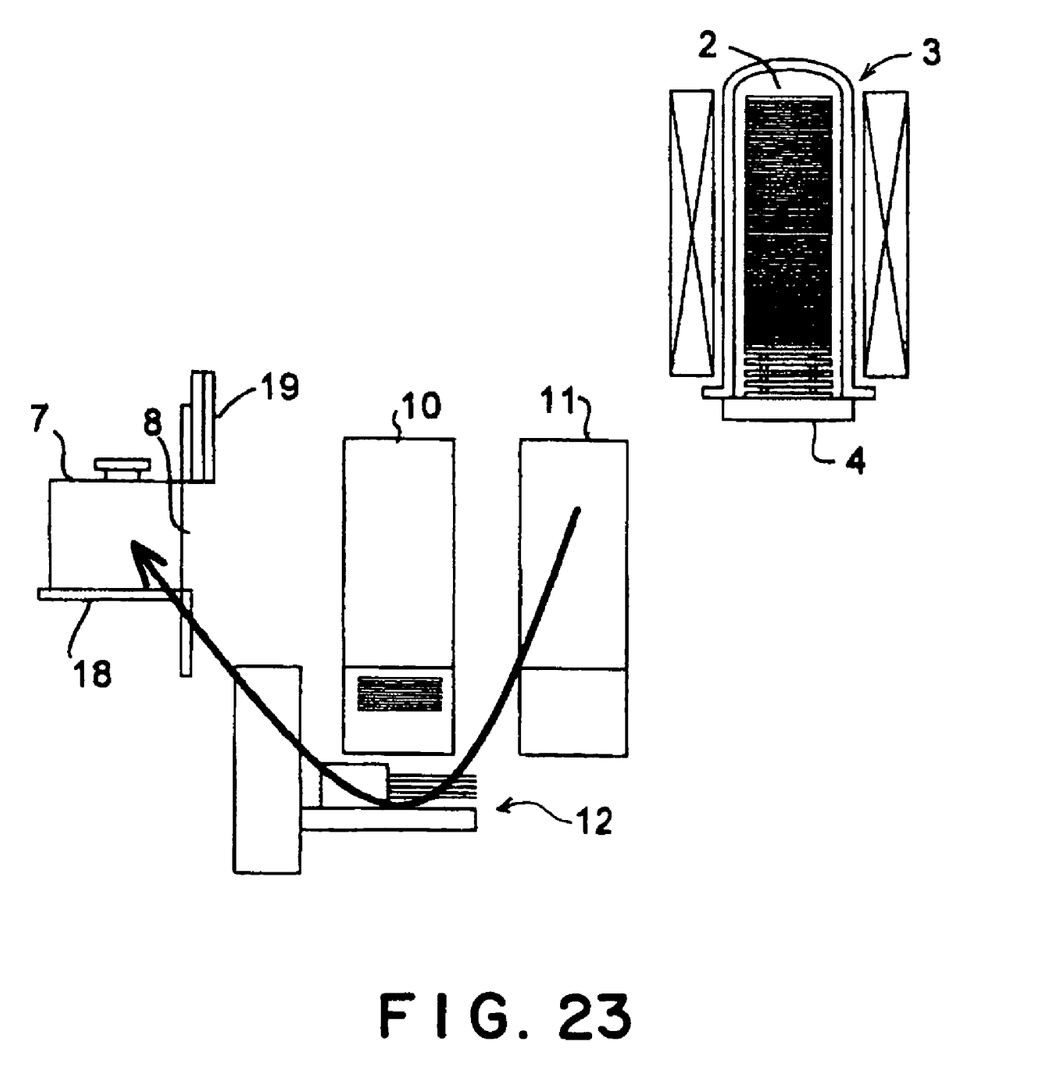
FIG. 23 is a schematic side view showing a step (fifth transferring step) of transferring the processed wafers from the second containing portion to the conveying container, during the thermal process (second thermal processing step).

After the third transferring step, as shown in FIG. 20, the wafers wa are transferred from the first containing portion 10 to the boat 2 by the transferring mechanism 12 (fourth transferring step). In addition, if necessary, as shown in FIG. 21, a predetermined number of dummy wafers dw are transferred from the dummy containing portions 21a and 21b to the boat 2 (fourth transferring step). After the fourth transferring step, as shown in FIG. 22, the boat 2 is loaded into the thermal processing furnace 3 (second loading step), so that the thermal process is conducted (second thermal processing step). During the thermal processing step (second thermal processing step), as shown in FIG. 23, the processed wafers are transferred from the second containing portion 11 to a vacant conveying container 7 connected to the connecting port 8 by the transferring mechanism 12 (fifth transferring step). Thus, one batch process is completed. After the fifth transferring step, the first transferring step explained with reference to FIG. 16 is conducted again. Then, the batch process is repeated in the same cycle.

As described above, according to the second operating method of the above vertical type of thermal processing apparatus, the apparatus can be made compact, cost of the apparatus can be reduced, and earthquake resistance of the apparatus can be improved. In addition, a small-amount batch process can be easily conducted.

In the above description, the embodiments of the present invention have been explained with reference to the attached drawings. However, the present invention is not limited to the above embodiments. Various modifications in design may be applied within a scope of the substance of the present invention.

The invention claimed is:

1. A method of using a vertical type of thermal processing apparatus including
   a thermal processing furnace having a furnace opening at a lower portion thereof, a boat holding objects to be processed in a tier-like manner in a vertical direction being adapted to be contained in the thermal processing furnace through the furnace opening in order to conduct a thermal process to the objects to be processed,
   a transferring chamber connected to the furnace opening,
   a lid supporting the boat, capable of closing the furnace opening,
   an elevating mechanism provided in the transferring chamber, configured to move up and down the lid in order to load and unload the boat into and out from the thermal processing furnace,
   a connecting port provided at a wall of the transferring chamber, capable of being connected to an opening of a conveying container for containing the objects to be processed,
   a first containing portion provided in the transferring chamber, capable of temporarily containing unprocessed objects to be processed for a next thermal process,
   a second containing portion provided in the transferring chamber, capable of temporarily containing processed objects to be processed conveyed out from the thermal processing furnace, and
   a transferring mechanism that transfers objects to be processed between the conveying container, the first containing portion, the second containing portion and the boat,
   the method comprising
   a first transferring step of transferring unprocessed objects to be processed from a conveying container onto the boat,
   a first loading step of loading the boat into the thermal processing furnace, after the first transferring step,
   a first thermal processing step of thermally processing the unprocessed objects to be processed held on the boat, after the first loading step,
   a second transferring step of transferring unprocessed objects to be processed from the conveying container or a next second conveying container to the first containing portion, during the first thermal processing step,
   a first unloading step of unloading the boat out from the thermal processing furnace, after the first thermal processing step,
   a third transferring step of transferring the processed objects to be processed held on the boat to the second containing portion, after the first unloading step,
   a fourth transferring step of transferring the unprocessed objects to be processed from the first containing portion to the boat, after the third transferring step,
   a second loading step of loading the boat into the thermal processing furnace, after the fourth transferring step,
   a second thermal processing step of thermally processing the unprocessed objects to be processed held on the boat, after the second loading step, and
   a fifth transferring step of transferring the processed objects to be processed from the second containing portion to the conveying container or the second conveying container, during the second thermal processing step.

2. A method of using a vertical type of thermal processing apparatus including
   a thermal processing furnace having a furnace opening at a lower portion thereof, a boat holding objects to be processed in a tier-like manner in a vertical direction being adapted to be contained in the thermal processing furnace through the furnace opening in order to conduct a thermal process to the objects to be processed,
   a transferring chamber connected to the furnace opening,
   a lid supporting the boat, capable of closing the furnace opening, an elevating mechanism provided in the transferring chamber, configured to move up and down the lid in order to load and unload the boat into and out from the thermal processing furnace, a connecting port provided at a wall of the transferring chamber, capable of being connected to an opening of a conveying container for containing the objects to be processed, a first containing portion provided in the transferring chamber, capable of temporarily containing unprocessed objects to be processed for a next thermal process, a second containing portion provided in the transferring chamber, capable of temporarily containing processed objects to be processed conveyed out from the thermal processing furnace, a dummy containing portion provided in the transferring chamber, capable of temporarily containing dummy objects to be processed, and a transferring mechanism that transfers objects to be processed between the conveying container, the first containing portion, the second containing portion, the dummy containing portion and the boat, the method comprising a first transferring step of transferring unprocessed objects to be processed from a conveying container onto the boat, and transferring dummy objects to be processed that have been contained in the dummy containing portion from the dummy containing portion onto the boat, a first loading step of loading the boat into the thermal processing furnace, after the first transferring step, a first thermal processing step of thermally processing the unprocessed objects to be processed held on the boat, after the first loading step, a second transferring step of transferring unprocessed objects to be processed from the conveying container or a next second conveying container to the first containing portion, during the first thermal processing step, a first unloading step of unloading the boat out from the thermal processing furnace, after the first thermal processing step, a third transferring step of transferring the processed objects to be processed held on the boat to the second containing portion, and transferring the dummy objects to be processed held on the boat to the dummy containing portion if necessary, after the first unloading step, a fourth transferring step of transferring the unprocessed objects to be processed from the first containing portion to the boat, and transferring dummy objects to be processed that have been contained in the dummy containing portion from the dummy containing portion onto the boat if necessary, after the third transferring step, a second loading step of loading the boat into the thermal processing furnace, after the fourth transferring step, a second thermal processing step of thermally processing the unprocessed objects to be processed held on the boat, after the second loading step, and a fifth transferring step of transferring the processed objects to be processed from the second containing portion to the conveying container or the second conveying container, during the second thermal processing step.

* * * * *